(12) United States Patent
Gondi et al.

(10) Patent No.: US 9,306,563 B2
(45) Date of Patent: Apr. 5, 2016

(54) CONFIGURABLE SINGLE-ENDED DRIVER

(71) Applicant: Lattice Semiconductor Corporation, Portland, OR (US)

(72) Inventors: Srikanth Gondi, Sunnyvale, CA (US); Roger Isaac, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 13/770,984

(22) Filed: Feb. 19, 2013

(65) Prior Publication Data

US 2014/0232446 A1    Aug. 21, 2014

(51) Int. Cl.
*H03K 3/00* (2006.01)
*H03K 19/00* (2006.01)
*H03K 19/0185* (2006.01)
*G11C 7/10* (2006.01)

(52) U.S. Cl.
CPC .............. *H03K 19/00* (2013.01); *G11C 7/1057* (2013.01); *H03K 19/018521* (2013.01); *H03K 19/018557* (2013.01)

(58) Field of Classification Search
USPC ....................................................... 327/382
See application file for complete search history.

(56) References Cited

U.S. PATENT DOCUMENTS

| | | |
|---|---|---|
| 5,982,210 A | 11/1999 | Rogers |
| 6,130,563 A | 10/2000 | Pilling et al. |
| 6,718,473 B1 | 4/2004 | Mirov et al. |
| 6,748,469 B1 | 6/2004 | Caldwell et al. |
| 6,845,420 B2 | 1/2005 | Resnick |
| 6,870,419 B1 | 3/2005 | Garrett et al. |
| 6,996,749 B1 | 2/2006 | Bains et al. |
| 7,036,032 B2 | 4/2006 | Mizuyabu et al. |
| 7,089,444 B1 | 8/2006 | Asaduzzaman et al. |
| 7,155,617 B2 | 12/2006 | Gary et al. |
| 7,496,774 B2 | 2/2009 | Lu |
| 7,505,512 B1 | 3/2009 | Anderson et al. |
| 2002/0061016 A1 | 5/2002 | Mullaney et al. |
| 2003/0074515 A1 | 4/2003 | Resnick |
| 2003/0105896 A1 | 6/2003 | Gredone et al. |
| 2004/0098545 A1 | 5/2004 | Pline et al. |
| 2005/0030200 A1 | 2/2005 | Holt |
| 2005/0052200 A1 | 3/2005 | Nguyen et al. |
| 2005/0174153 A1 | 8/2005 | Saeki |

(Continued)

FOREIGN PATENT DOCUMENTS

| | | |
|---|---|---|
| CN | 1959801 A | 5/2007 |
| CN | 101904100 A | 12/2010 |

(Continued)

OTHER PUBLICATIONS

Non-Final Office Action for U.S. Appl. No. 11/690,659 mailed Feb. 23, 2010.

(Continued)

*Primary Examiner* — Lincoln Donovan
*Assistant Examiner* — Patrick Chen
(74) *Attorney, Agent, or Firm* — Fenwick & West LLP

(57) ABSTRACT

Embodiments of the invention are generally directed to a configurable single-ended driver. An embodiment of an apparatus includes an interface with a channel; and a single-ended driver to drive a signal on the channel, wherein the driver includes a mechanism to configure a termination resistance of the driver, configure a voltage swing of the driver, and configure a signal response of the driver.

22 Claims, 14 Drawing Sheets

(56) References Cited

U.S. PATENT DOCUMENTS

| | | | |
|---|---|---|---|
| 2005/0242851 | A1 | 11/2005 | Booth et al. |
| 2006/0017470 | A1* | 1/2006 | Park et al. .................. 326/121 |
| 2006/0192622 | A1 | 8/2006 | Narita |
| 2007/0035336 | A1 | 2/2007 | Lee |
| 2007/0080718 | A1 | 4/2007 | Stojanovic et al. |
| 2007/0230513 | A1 | 10/2007 | Talbot et al. |
| 2007/0252624 | A1* | 11/2007 | Sohn .......................... 327/108 |
| 2007/0281741 | A1 | 12/2007 | Lu et al. |
| 2008/0122488 | A1 | 5/2008 | Chen |
| 2008/0164905 | A1 | 7/2008 | Hamanaka |
| 2008/0310491 | A1 | 12/2008 | Abbasfar et al. |
| 2009/0059712 | A1* | 3/2009 | Lee et al. ............... 365/230.06 |
| 2009/0182912 | A1 | 7/2009 | Yoo et al. |
| 2009/0256585 | A1 | 10/2009 | Kwon et al. |
| 2009/0289668 | A1 | 11/2009 | Baldisserotto et al. |
| 2009/0327565 | A1 | 12/2009 | Ware |
| 2010/0060316 | A1 | 3/2010 | Kim et al. |
| 2010/0097094 | A1 | 4/2010 | Jang |
| 2010/0103994 | A1 | 4/2010 | Frans et al. |
| 2010/0127751 | A1 | 5/2010 | Lin |
| 2010/0157644 | A1 | 6/2010 | Norman |
| 2010/0164539 | A1 | 7/2010 | Balamurugan et al. |
| 2010/0296566 | A1 | 11/2010 | Beyene et al. |
| 2011/0050280 | A1 | 3/2011 | Maddux et al. |
| 2011/0193591 | A1 | 8/2011 | Nguyen et al. |
| 2011/0196997 | A1 | 8/2011 | Ruberg et al. |
| 2011/0222594 | A1 | 9/2011 | Zerbe et al. |
| 2011/0260756 | A1* | 10/2011 | Agut .............................. 327/81 |
| 2013/0002301 | A1 | 1/2013 | Gondi et al. |
| 2013/0038346 | A1 | 2/2013 | Hollis |

FOREIGN PATENT DOCUMENTS

| | | |
|---|---|---|
| CN | 102075462 A | 5/2011 |
| EP | 0834814 | 4/1998 |

OTHER PUBLICATIONS

Notice of Allowance for U.S. Appl. No. 11/690,659 mailed Aug. 25, 2010.
International Search Report and Written Opinion for International Patent Application No. PCT/US2011/023697, Mailed Oct. 25, 2011, 11 pages.
Final Office Action for U.S. Appl. No. 12/704,417, Mailed Feb. 14, 2012, 19 pages.
Kevin Ross, The Basics-Very Basic Circuits, Mar. 1997, www.seattlerobotics.org.
B. Leibowitz, et al., "A 4.3GB/s Mobile Memory Interface With Power-Efficient Bandwidth Scaling," IEEE J. Solid-State Circuits, Apr. 2010.
H. Partovi, et al., "Single-ended Transceiver Design Techniques for 5.33Gb/s Graphics Applications," IEEE International Solid-State Circuits Conference, Feb. 2009.
High-Definition Multimedia Interface Specification Version 1.3, HDMI Licensing LLC, Jun. 22, 2006, 237 pages.
International Search Report and Written Opinion of the International Searching Authority in International Patent Application No. PCT/US2012/043767, 15 pages.
International Search Report and Written Opinion of the International Searching Authority in International Patent Application No. PCT/US2012/043770, 9 pages.
K-L J. Wong, et al., "A 27mW 3.6-Gb/s I/O Transceiver," IEEE J. Solid-State Circuits, Apr. 2004.
Low Power Double Data Rate 2 (LPDDR2) Standard, JEDEC Solid State Technology Association, Apr. 2011, 284 pages.
Office Action dated Jan. 15, 2013, in U.S. Appl. No. 13/174,630, 13 pages.
Office Action mailed Aug. 31, 2011, in U.S. Appl. No. 12/704,417, 12 pages.
Office Action mailed Jan. 15, 2013, in U.S. Appl. No. 13/174,616, 15 pages.
Seung-Jun Bae, et al., "An 80nm 4Gb/s/pin 32 bit 512Mb GDDR4 Graphics DRAM with Low Power and Low Noise Data Bus Inversion," IEEE J. Solid-State Circuits, Jan. 2008.
W. D. Dettloff, et al., "A 32mW 7.4Gb/s Protocol-Agile Source-Series Terminated Transmitter in 45nm CMOS SOI," IEEE International Solid-State Circuits Conference, Feb. 2010.
International Preliminary Report on Patentability mailed Aug. 7, 2008 in International Application No. PCT/US2008/57926, 6 pages.
Office Action mailed Nov. 6, 2013, in U.S. Appl. No. 13/174,630, 13 pages.
PCT International Search Report, PCT Application No. PCT/US2014/016091, May 26, 2014, 10 pages.
Partovi, H. et al., "Single-Ended Transceiver Design Techniques for 5.33Gb/s Graphics Applications," International Solid-State Circuits Conference (ISSCC), San Francisco, CA, IEEE, Feb. 2009, 3 pages.
Chinese First Office Action, Chinese Application No. 201280025948.1, Jan. 4, 2015, 14 pages.
European Extended Search Report, European Application No. 12803660.5, Oct. 7, 2014, 11 pages.
Balamurugan, G. et al., "Modeling and Analysis of High-Speed I/0 Links," IEEE Transactions on Advanced Packaging, May 2009.
International Search Report and Written Opinion of the International Searching Authority dated Nov. 25, 2013, in International Patent Application No. PCT/US2013/052126, 13 pages.
Lee, H. et al., "A 16 Gb/s/Link, 64 GB/s Bidirectional Asymmetric Memory Interface," IEEE J. Solid-State Circuits, Apr. 2009.
Palermo, S. et al., "A 90 nm CMOS 16 Gb/s Transceiver for Optical Interconnects," IEEE J. Solid-State Circuits, May 2008.
Razavi, B., "Prospects of CMOS Technology for High-Speed Optical Communication Circuits," IEEE J. Solid-State Circuits, Sep. 2002.
US Office Action mailed Nov. 6, 2013, in U.S. Appl. No. 13/174,630, 13 pages.
US Office Action mailed Aug. 2, 2013, in U.S. Appl. No. 13/934,147, 6 pages.

\* cited by examiner

CONFIGURABLE SINGLE-ENDED DRIVER

TECHNICAL FIELD

Embodiments of the invention generally relate to the field of electronic devices and, more particularly, to a configurable single-ended driver.

BACKGROUND

In the communication of signals between devices or elements, a driver is used to drive a signal on an interface between the devices or elements. For example, a driver may be required for driving signals in a high-speed memory interface and similar processes.

An interface may include one or more single-wire connections, and single-ended driver may thus drive a signal on the single-wire connection. A single-wire connection may include, for example, a DRAM (Dynamic Random Access Memory) interface.

However, conventional single-ended drivers have limitations that make then problematic in low power operations. Limitations of existing drivers may include excessive power dissipation; differential structures with double the speed requirements; lack of flexibility in termination; lack of flexibility for voltage swings; an absolute relation between supply and voltage swings; a requirement for a voltage regulator with large decoupling caps; and limited data rates.

The use of existing single-ended drivers in implementations such as mobile interfaces will suffer from the above limitations. Efforts have been made in conventional devices to mitigate certain of these limitations. However, conventional solutions generally create tradeoffs with others of these limitations, and thus do not provide effective designs for future technologies.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
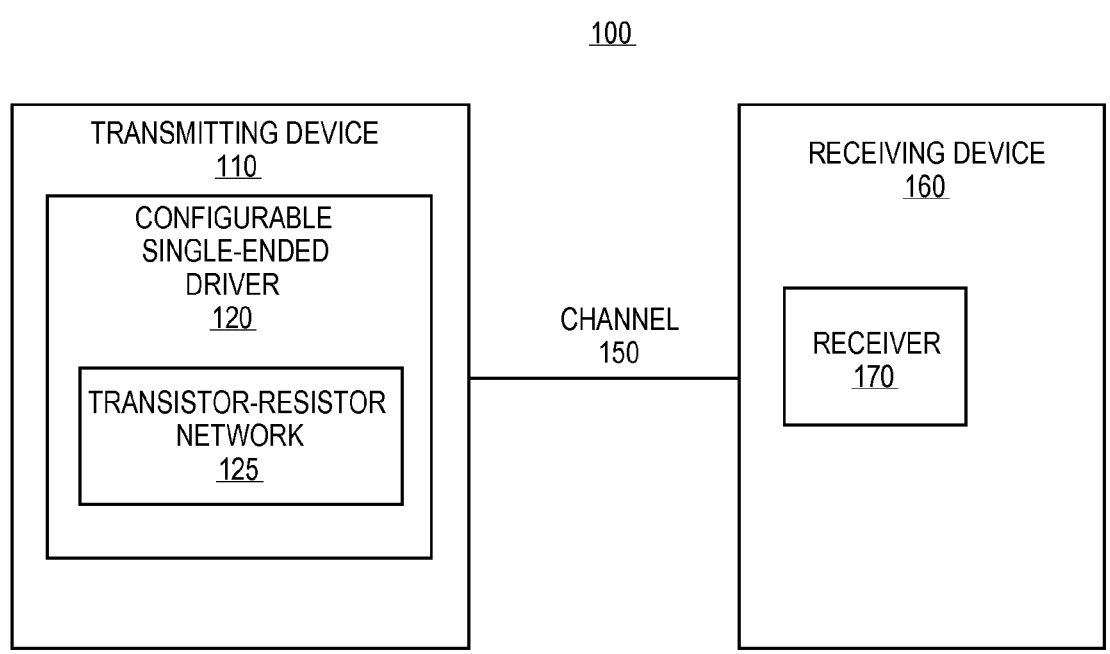
FIG. 1 is an illustration of an interface including a configurable single-ended driver according to an embodiment.

Embodiments of the invention are generally directed to a configurable single-ended driver.

In a first aspect of the invention, an embodiment of an apparatus includes an interface with a channel; and a single-ended driver to drive a signal on the channel, wherein the driver includes a mechanism to configure a termination resistance of the driver, configure a voltage swing of the driver, and configure a signal response of the driver.

In a second aspect of the invention, an embodiment of a single-ended driver to drive a signal on a channel includes a means for configuring a termination resistance of the driver, a means for configuring a voltage swing of the driven signal, and a means for configuring a signal response of the driver.

In a third aspect of the invention, an apparatus includes an interface with a channel; and a single-ended driver to drive a signal on the channel, wherein the driver includes: a first portion to switch on when the driver drives a first signal value on the channel, the first portion including a first branch and a second branch, a second portion to switch on when the driver drives a second signal value on the channel, the second portion including a third branch and a fourth branch, the first branch and the third branch being coupled together at a first node and the second branch and the fourth branch being coupled together at a second node, the second node being an output node, and a third portion including a capacitance, a first end of the third portion being coupled with the first node and a second end of the third portion being coupled with the second node.

DETAILED DESCRIPTION

Embodiments of the invention are generally directed to a configurable single-ended driver.

In some embodiments, a driver front-end design is provided for high-speed wire-line memory interfaces, including, for example, DRAM interfaces. In some embodiments, a configurable driver incorporates reduced voltage swing and single-ended concepts to improve power efficiency. In some embodiments, a configurable driver provides a low swing link without requiring an extra driver. In some embodiments, the entire circuit of a driver may be supplied by a standard source voltage.

In some embodiments, a configurable driver includes a mechanism containing a network of transistors and resistors for modifying the resistance of the driver, output voltage swing, signal response, or any combination of such requirements. This modification could be made to improve the power efficiency of the driver or the link.

More specifically, in some embodiments, a configurable driver includes a mechanism that enables:

(1) Configuring a termination resistance of the driver;

(2) Configuring a voltage swing of the driver without modifying the supply voltage; and (3) Configuring a signal response of the driver, wherein the configuration of the signal response predominantly affects the signal response during the signal rise times and fall times for the driver.

In some embodiments, a System-on-Chip (SOC) design may incorporate a configurable low power single-ended driver in optimizing a power/performance tradeoff for mobile systems. In some embodiments, low power I/O (Input/output) techniques may be applicable to standards both within the scope of an SOC, and outside the scope of such an apparatus. As used herein, "optimizing" refers to operations to improve certain factors, such as improving operations of an apparatus or system in one or more ways, and does not necessarily refer to obtaining an optimum solution.

In some embodiments, a configurable single-ended driver may be utilized in a wide variety of implementations for memory systems and electrical I/O interfaces in general. Due to the unique requirements of DRAM interfaces, embodiments may include several techniques that will enable or enhance the performance of next-generation electrical interfaces, especially for mobile devices, which require operation with reduced supply voltages and reduced power consumption.

FIG. 1 is an illustration of an interface including a configurable single-ended driver according to an embodiment. In this illustration, a system 100 includes a transmitting device 110 to transmit signals over a channel 150 to a receiving device 160, where the channel includes one or more conductors. In some embodiments, the transmitting device 110 includes one or more configurable single-ended drivers 120 to drive signals on the channel 150 and the receiving device 160 includes one or more receivers 170 to receive signals driven on the channel. In some embodiments, multiple transmitting and/or receiving devices are implemented. In some embodiments, the driver 120 has a mechanism that includes a transistor-resistor network 125, wherein the mechanism allows for modifying the resistance of the driver, output voltage swing, signal response, or any combination or all of such requirements. In some embodiments, the modification by the mechanism of either resistance of the driver or output voltage swing is based on choosing a corresponding number of transistor-resistor branches. For example, a branch of a driver, such as the branch consisting of M2 214 and R2 226 in FIG. 2, may be an equivalent representation of multiple sub-branches in parallel that are each configured to be enabled by a switch, such as a MOS switch (not shown in FIG. 2). Similarly, the other branches in FIG. 2 and other figures illustrating drivers may be equivalent representations of multiple sub-branches that are each configured to be enabled based on specific termination, swing, and signal response requirements. Reducing the output swing improves the power efficiency of the driver or the link. In some embodiments, the mechanism further allows for configuring a signal response of the driver, wherein the configuration of the signal response predominantly affects the signal response during the signal rise times and fall times for the driver.

In some embodiments, the network 125 is implemented utilizing a first set of transistors and resistors for a first signal (such as a HIGH signal) and a second set of transistors and resistors for a second signal (such as a LOW signal). In some embodiments, the network 125 includes a capacitance to assist in modifying a signal response during periods with a rising signal and periods with a falling signal.

Figure 2:
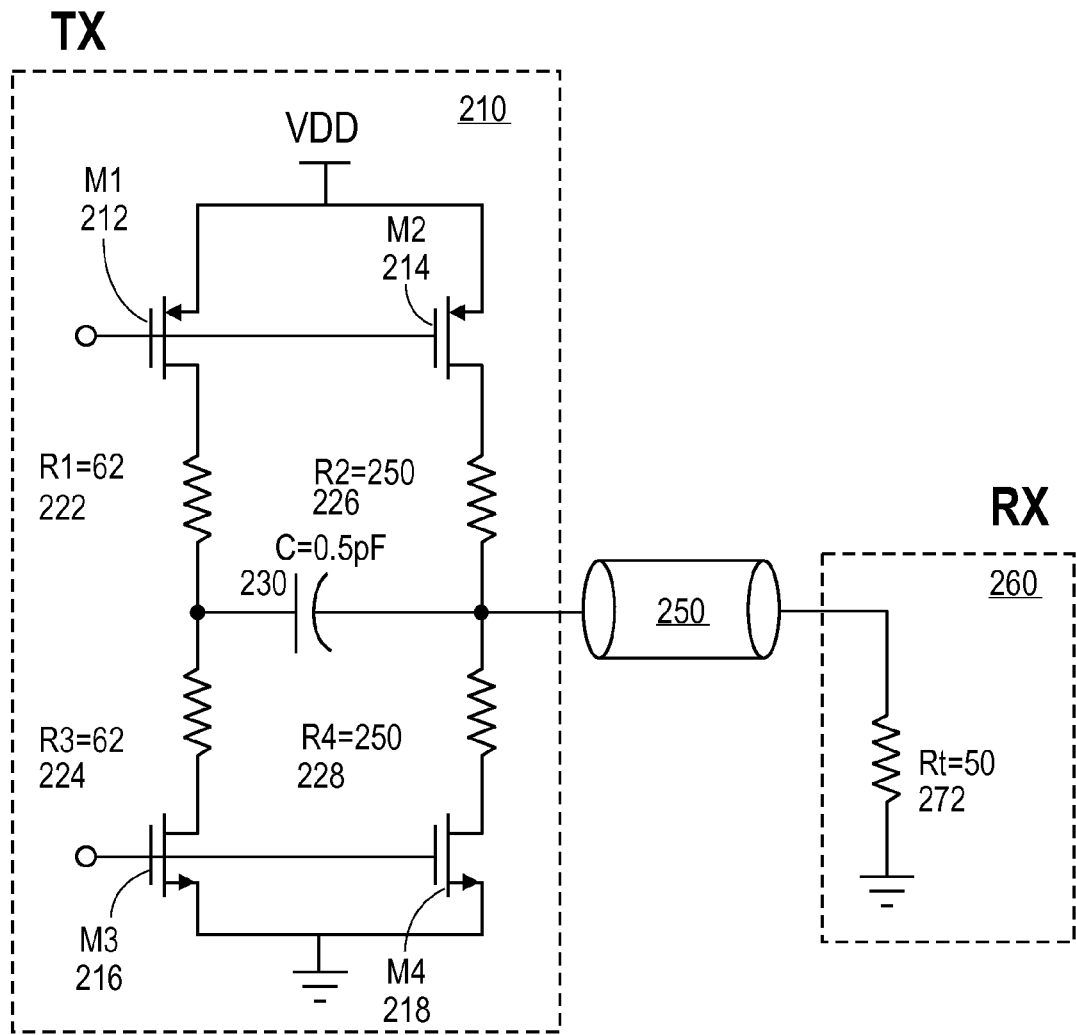
FIG. 2 illustrates an embodiment of a configurable single-ended driver circuit including MOS switches.

In some embodiments, a configurable single-ended driver is implemented utilizing MOS (Metal Oxide Semiconductor) switches. FIG. 2 illustrates an embodiment of a configurable single-ended driver circuit including MOS switches. As illustrated in FIG. 2, in some embodiments top PMOS (P-Type Metal-Oxide Semiconductor) and bottom NMOS (N-Type Metal-Oxide Semiconductor) transistors act as switches in driver operation, where such switches may be utilized to, for example, to reduce power consumed in driving signals.

In some embodiments, a single-ended driver circuit includes a first portion for a first signal value (such as a HIGH signal), the first portion including a first branch and a second branch, the first branch including a first transistor to switch a connection to a first resistor and the second branch including a second transistor to switch a connection to a second resistor. In some embodiments, the single-ended driver circuit includes a second portion for a second signal value (such as a LOW signal), the second portion including a third branch and a fourth branch, the third branch including a third transistor to switch a connection to a third resistor and the fourth branch including a fourth transistor to switch a connection to a fourth resistor. In some embodiments, the single-ended driver circuit includes a third portion, the third portion including a capacitor to configure a signal response of the first and second signal values. In some embodiments, the first branch of the first portion, the third branch of the second portion, and a first end of the third portion are coupled with a first node, and the second branch of the first portion, the fourth branch of the second portion, and a second end of the third portion are coupled with a second node, the second node being an output node.

Figure 2A:
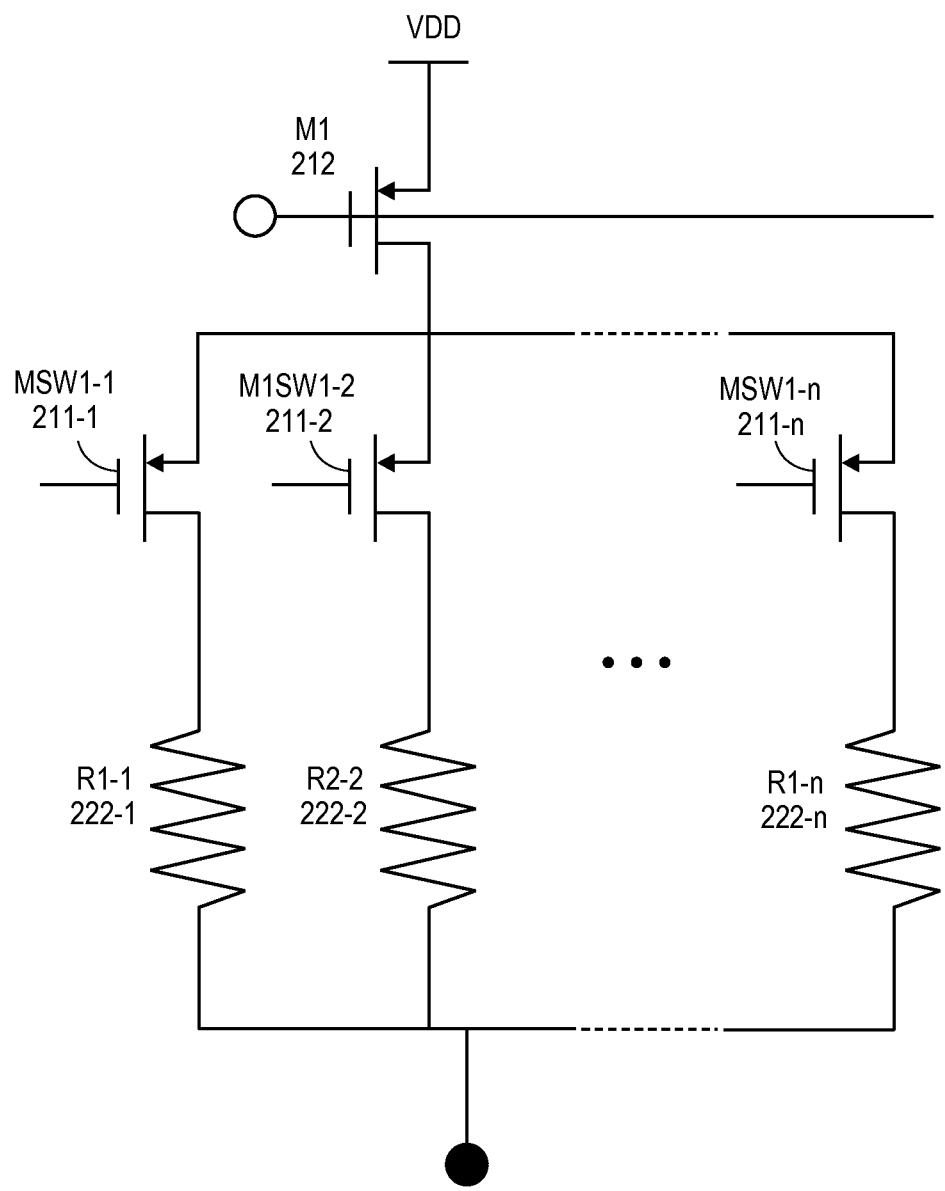
FIG. 2A illustrates sub-branches of a circuit branch in a driver embodiment.
Figure 2B:
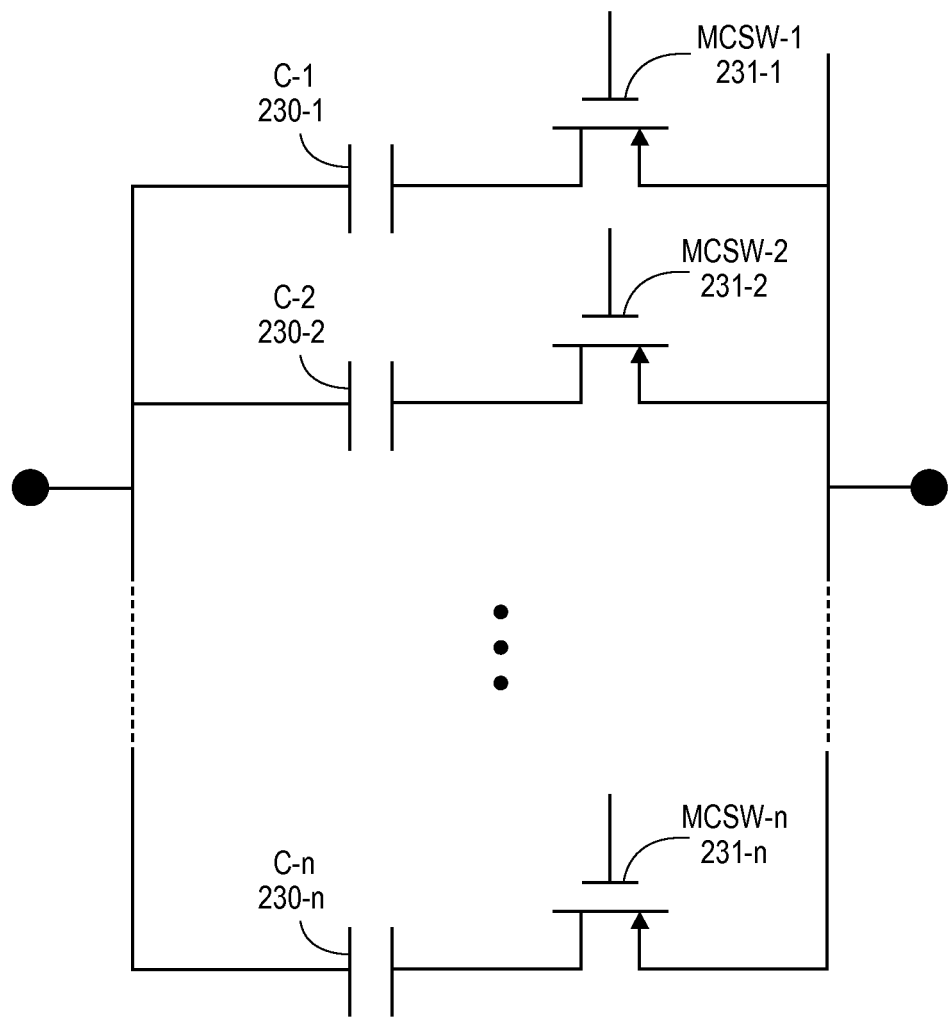
FIG. 2B illustrates sub-branches of a capactive circuit branch in a driver embodiment.

As further illustrated in FIG. 2, a single-ended driver 210 is coupled with a receiver 260 via a channel 250. A first (source) terminal of a first PMOS transistor, M1 212, and a first (source) terminal of a second PMOS transistor, M2 214, are connected to a source voltage VDD. A second (drain) terminal of the first PMOS transistor 212 is coupled with a first end of a resistor R1 222 (62Ω in this implementation) and a second (drain) terminal of second PMOS transistor 214 is coupled with a first end of a resistor R2 226 (250Ω). In this illustration, the first branch of the first portion of the driver 210 includes M1 212 and R1 222, and a second branch of the first portion of the driver 210 includes M2 214 and R2 226. In some embodiments, one or more of the branches of the driver 210 is composed of a plurality of sub-branches, wherein each sub-branch includes a switching component, and where any number of the sub-branches may be enabled or disabled by enabling or disabling the switching component to allow for modification of the values of the components of the branch. In some embodiments, the sub-branches are as illustrated in FIGS. 2A and 2B.

As shown in FIG. 2, a gate terminal of the first PMOS transistor 212 is coupled with a gate terminal of the second PMOS transistor 214. In some embodiments, a second end of resistor R1 222 is coupled with a first end of a resistor R3 224 (62 ohms) and a first end of a capacitor 230 (0.5 pF (pico-Farad)). A second end of resistor R2 226 is coupled with a first end of a resistor R4 228 (250 ohms), a second end of the capacitor 230, and to an output node for connection with a first end of the channel 250. A second end of resistor R3 224 is coupled with a first (drain) terminal of a first NMOS transistor, M3 216, and a second end of resistor R4 228 is coupled with a first (drain) terminal of a second NMOS transistor, M4 218. A second (source) terminal of the M3 216 and a second (source) terminal of M4 218 are coupled with ground. A gate terminal of M3 216 is coupled with a gate terminal of M4 218. The receiver 260 includes a node for connection with a second end of the channel 250, the receiver 260 having termination resistance Rt 272 (50 ohms). In this illustration, the third branch of the second portion of the driver 210 includes M3 216 and R3 224, and a fourth branch of the second portion of the driver 210 includes M4 218 and R4 228. In this illustration, the third portion of the driver 210 includes capacitor 230.

In some embodiments, the driver 210 in FIG. 2, as well as, for example, the drivers illustrated in FIGS. 3, 4, 7, and 8, may be configured to set or change the component values of the branches of the driver, including the resistance of the first, second, third, and fourth branches, to configure a termination resistance of the driver; a voltage swing of the driver; or a signal response of the driver. In some embodiments, such characteristics of the driver may be varied independently from one or more of the other characteristics of the driver. In some embodiments, the component values are varied through the enablement and disablement of sub-branches of the branches of the driver, such as illustrated in FIGS. 2A and 2B. In some embodiments, the configuration of the driver may include setting or changing of the component values of multiple branches to allow for configuring one or more of the characteristics of the driver independently of one or more of the other characteristics of the driver, such as, for example, setting a voltage swing for the driver while maintaining a termination resistance for the driver.

In some embodiments, a feedback loop that includes a voltage detection circuitry (not shown in FIG. 2) is implemented to configure a termination resistance of the driver, a voltage swing of the driver, or a signal response of the driver. In some embodiments, the elements of a mechanism to configure such characteristics of a driver may include elements described in U.S. patent application Ser. No. 13/174,630, "Single-Ended Configurable Multi-mode Driver", published as U.S Patent Application Publication No. 2013/0002301. The configuration of each of these parameters may or may not be performed independently of the other parameters depending on the particular embodiment or implementation.

"Termination", as used herein, refers to the magnitude of the impedance of a given network. As illustrated in FIG. 2, the termination value in the bit '1' state is dependent on the equivalent impedance seen by the two paths: the first path including the resistance value of resistor R2 226 and transistor M2 214 (which resistance is much smaller than R2 226 in some embodiments), while the second path includes capacitance C 230, R1 222 and transistor M1 212. The second path impedance is frequency dependent and, hence, the termination value is frequency dependent as well. Therefore, the target component values for the illustrated embodiments are based on targeted termination values at certain frequencies for bit '1' and bit '0' states. The targeted frequencies in turn depend on the target bit rates or edge rates in an NRZ (Non-Return to Zero) waveform. For example, for a 4 Gbps (Gigabits per second) data rate, any of the frequencies below 4 GHz (GigaHertz) could be used for termination calculation.

For the embodiment shown in FIG. 2, the following methodology may be adopted to configure the termination value of the driver, the swing voltage, and the signal response of the driver, wherein the configuration of the signal response may predominantly affect signal response during the signal rise times and fall times for the driver. For example, if the termination target is 162 ohms at 2 GHz, the swing target is VDD/6, and the rise and fall times are targeted to be within one-third the bit period while avoiding peaks in the signals (or shoot through currents through VDD or ground).

(1): The signal swing (steady-state) is determined by VDD*Rt/(Rt+R2). If Rt 272 is equal to 50 ohms (termination on the receiver), which is the case in most applications, then R2 226 is equal to 250 ohms. If the channel 250 has notable resistance then Rt in the above equation could be replaced by the sum of Rt and the resistance of channel 250.

(2): With a termination target of 162 ohms at 2 GHz for bit '1' or bit '0' states, several values are possible for R1 222, C 230, R3 224 and R4 228. Considering that the signal response needs to satisfy the criteria of achieving one-third of the bit period while minimizing peaking in the signals, it can be determined (with simulations such as simulations performed using tools like SPICE (Simulation Program with Integrated Circuit Emphasis)) that the following values for components R1 222, C 230, R3 224 and R4 228 will satisfy the targeted criteria:

R1=62 ohms
C=0.5 pF
R3=62 ohms
R4=250 ohms

The described parameter values for the embodiment illustrated in FIG. 2 are example values based on certain requirements for a specific application. It is quite evident, for somebody familiar with the art, to modify these values based on a given application or requirement.

FIG. 2A illustrates sub-branches of a circuit branch in a driver embodiment. In some embodiments, one or more of the branches of a driver is composed of a plurality of sub-banches in parallel. In some embodiments, each of the sub-branches include a switching component, including, for example, a transistor, that is operable to enable or disable the sub-branch.

In some embodiments, a branch of a driver circuit, such as the first branch of the driver 210 illustrated in FIG. 2, includes n sub-branches, where any number of the sub-branches may be independently enabled or disabled to establish the equivalent value of the circuit components. In some embodiments, the first branch of a driver includes a plurality of sub-branches in parallel representing the resistor value. In this illustration, MOS transistor M1 212 is coupled with a plurality of sub-branches that represent the resistance illustrated as resistor R1 222 in FIG. 2.

In some embodiments, a first sub-branch of the first branch includes a switching component such as the illustrated switching transistor MSW1-1 211-1 and a resistor R1-1 222-1, where transistor MSW1-1 receives an input to switch the transistor on or off to either enable or disable the connection of resistor R1-1. In some embodiments, the first branch further includes a second sub-branch composed of switching transistor MSW1-1 211-2 and a resistor R1-2 222-2, and continuing through an nth sub-branch composed of switching transistor MSW1-$n$ 211-$n$ and a resistor R1-$n$ 222-$n$. In some embodiments, the resistance of resistor R1 222 illustrated in FIG. 2 is set by enabling or disabling the switching transistors of the sub-branches of the first branch, and thus determining how many resistors of the sub-branches are connected in parallel with each other. In this illustration, resistance of R1 of FIG. 2 is equal to the resistances of whichever of resistors R1-1 through R1-$n$ that are enabled.

For example, if the sub-branches in FIG. 2A have a resistance value of 372 ohms in each sub-branch and the targeted value is 62 ohms (as shown in FIG. 2), then six sub-branches in FIG. 2A are enabled. In some embodiments, precise values may not be achieved, in which case the closest value is configured by enabling the required number of sub-branches.

FIG. 2B illustrates sub-branches of a capactive circuit branch in a driver embodiment. In some embodiments, a capacitor of a driver, such as capacitor 230 of FIG. 2, is composed of n sub-branches, where any number of the plurality sub-branches may be independently enabled or disabled to establish the value of the circuit components.

In some embodiments, a capacitor branch of a driver, such as the capacitor branch containing capacitor 230 in FIG. 2, includes n sub-branches in parallel representing the capacitive value of capacitor 230.

In some embodiments, a first sub-branch of the capacitor branch includes a switching transistor MCSW1-1 (231-1) and a capacitor C-1 (230-1), where transistor MCSW1-1 receives an input to switch the transistor on or off to either enable or disable the connection of capacitor C-1. In some embodiments, the capacitor branch further includes a second sub-branch including switching transistor MCSW1-2 (231-2) and a capacitor C-2 (230-2), and continuing through an nth sub-branch composed of switching transistor MCSW1-n (231-n) and capacitor C-n (230-n). In some embodiments, the capacitance of C 230 illustrated in FIG. 2 is set by enabling or disabling the switching transistors of the sub-branches of the capacitor branch, and thus determining how many capacitors of the sub-branches are connected in parallel with each other.

For example, if the sub-branches in FIG. 2B have a capacitance value of 0.1 pF in each sub-branch and the targeted value is 0.5 pF (as shown in FIG. 2), then five sub-branches in FIG. 2B are enabled. In some embodiments, precise values may not be achieved, in which case the closest value is configured by enabling the required number of sub-branches.

While FIGS. 2A and 2B illustrate particular examples of the structure of sub-branches, sub-branches of a branch of a driver are not limited to the particular components illustrated, and may, for example, include additional components in the sub-branch to represent one or more additional components in the branch.

In some embodiments, one or more branches of a driver circuit, including, for example, the driver circuits illustrated in FIGS. 2, 3, 4, 7, and 8, include one or more branches that are composed of a plurality of sub-branches as illustrated in FIGS. 2A and 2B.

Figure 3:
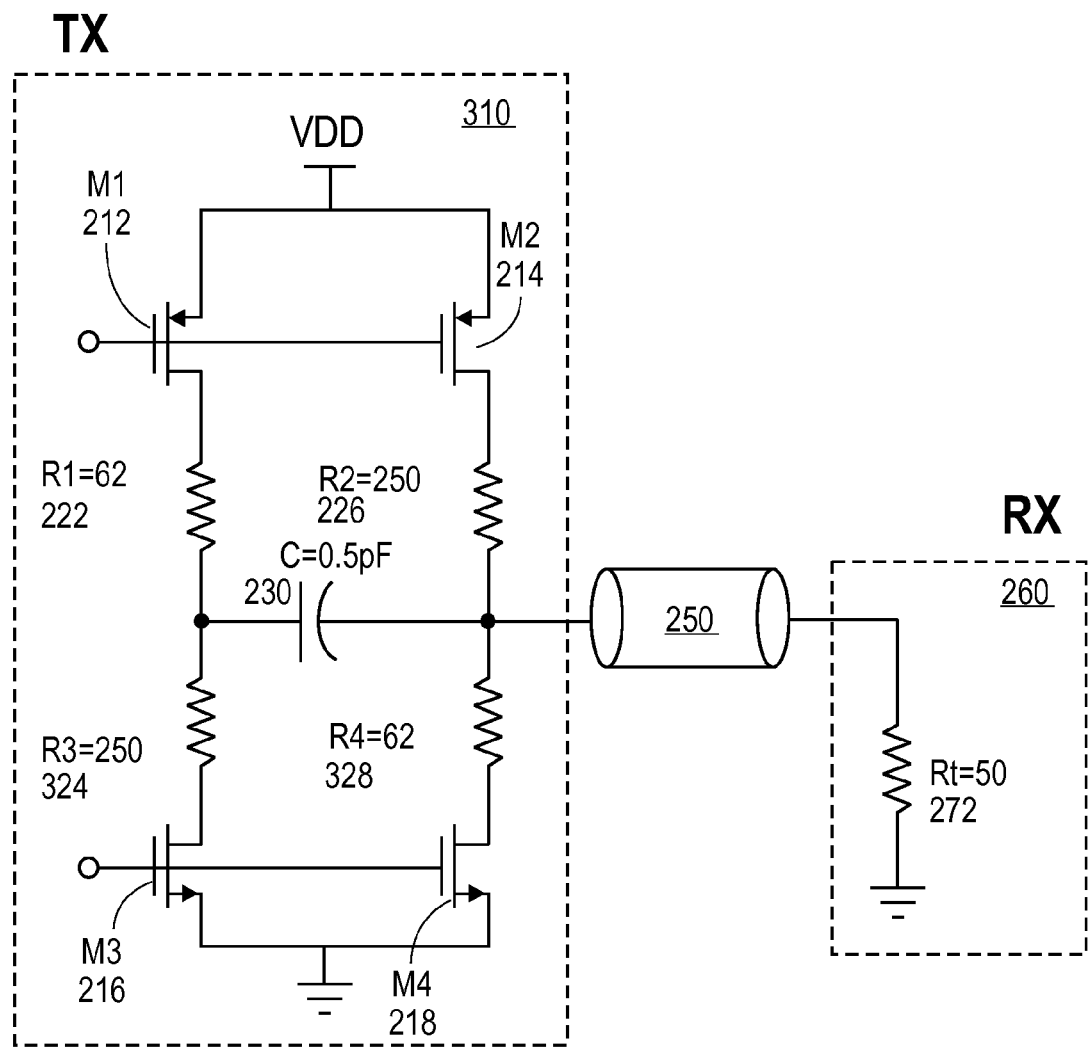
FIG. 3 illustrates a modified embodiment of a configurable single-ended driver circuit including MOS switches.

FIG. 3 illustrates a modified embodiment of a configurable single-ended driver circuit including MOS switches. As illustrated in FIG. 3, a single-ended driver 310 is coupled with the receiver 260 via the channel 250. In the illustrated embodiment, in comparison with FIG. 2, resistor R3 224 is substituted with resistor R3 324 (250Ω, rather than 62 ohms), and resistor R4 228 is substituted with resistor R4 328 (62 ohms, rather than 250 ohms).

In the circuit embodiments illustrated in FIGS. 2 and 3, no bias voltage is required for driver 210 of FIG. 2 or driver 310 of FIG. 3. In some embodiments, the structures may be utilized in applications where startup time is critical. In the illustrated structures, the matching of termination resistance to 50 ohms is compromised during a steady state fraction of the bit period. In a particular implementation, average power consumption of the driver may be reduced significantly (up to 55%) compared with a driver that utilizes an absolute 50 ohms matching during the entire bit period. The 50 ohms matching target is based on the characteristic impedance of the channel, which is 50 ohms for most applications. However, some applications may dictate the use of channels that are higher or lower than 50 ohms, in which case the matching target could be equal to the channel impedance. For example, if the channel's characteristic impedance is 75 ohms then the driver termination matching target could also be 75 ohms.

In structure shown in FIG. 2, at the beginning of each bit period, top resistors R1 222 and R2 226 (for bit '1') or bottom resistors R3 224 and R4 228 (for bit '0') are in parallel and provide a 50 ohm termination during a rise or fall transition time at the TX side. In the illustrated embodiment, after charging capacitor C 230 and entering the steady state phase, the path to VDD through R1 is opened and R2 is essentially the only path that drives the channel. The voltage division between R2 226 and Rt 292 will result in an output swing of approximately VDD/6 (neglecting the resistance contribution of M2 214). In this embodiment, disconnection of R1 222 during the steady state phase (or static phase) will improve the power efficiency significantly. This is because all current drawn from the VDD goes directly to the load and no current is wasted at the driver. For example, for VDD=1.2 Volts, I=4 mA current will flow to the load and create a 200 mV swing. In such an implementation, the average power will be reduced by 55% compared with a similar structure with an extra resistor to ground that may guarantee a 50 ohm resistance but demands 6.6 mA current drawn from VDD supply. Further, no current other than leakage current is drawn when the output of the driver is driven to bit '0'.

In the circuit of FIG. 2, when driving a HIGH signal on the first end of the channel 250, the electrical path through M2 214 and R2 226, and through M1 212, R1 222, and C 230, are the open paths to the output. The path through M1 212, R1 222 and C 230 provides a lower impedance path during a signal transition, thereby improving the rise time when the output signal transitions from a LOW signal level to a HIGH signal level. Similarly, while driving a LOW signal on the first end of the channel 250, the electrical paths through R4 228 and M4, 218, and through C 230, R3 224 and M3 216, are the open paths to the output. In this scenario, the path through C 230, R2 224, and M2 216 provides a low impedance path that improves the fall time when the output signal transitions from a HIGH signal level to a LOW signal level. The capacitor C 230 does not pass through a static current and the path through R4 228 and M4 218 is only ON in the LOW state; the only path for static current is through M2 214 and R2 226, which is open only when the output is being driven to a HIGH state. Therefore, the dominant part of the static power (leakage still exists in other paths) for this driver is determined by the circuit parameters in the M2 214 and R2 226 paths as well as the channel characteristics. By having a larger resistance through M2 214 and R2 226 the overall current flow is limited and which results in improved power dissipation.

An issue with the embodiment illustrated in FIG. 2 is that, in steady state mode, low frequency matching will be degraded because of the termination to 250 ohms instead of 50 ohms, which affects the signal integrity performance of the driver due to the reduced effectiveness in absorbing signal reflections in the channel. In some embodiments, in order to improve S11 (S-Parameter—input port voltage reflection coefficient) for low frequency, FIG. 3 provides for swapping of the resistances of R3 224 and R4 228 of FIG. 2, with R3 324 being 250 ohms and R4 328 being 62 ohms, providing the structure shown in FIG. 3. The revised structure illustrated in FIG. 3 may be utilized to provide improved matching performance for bit '0' state, and hence enlarge the eye diagram because the structure of FIG. 3 removes or reduces destructive effects of reflection on bit '0'. In some embodiments, similar improvements in signal integrity performance may be made by swapping R1 222 and R2 226 for bit '1' state, but this change would be made at the cost of increased power dissipation.

Figure 4:
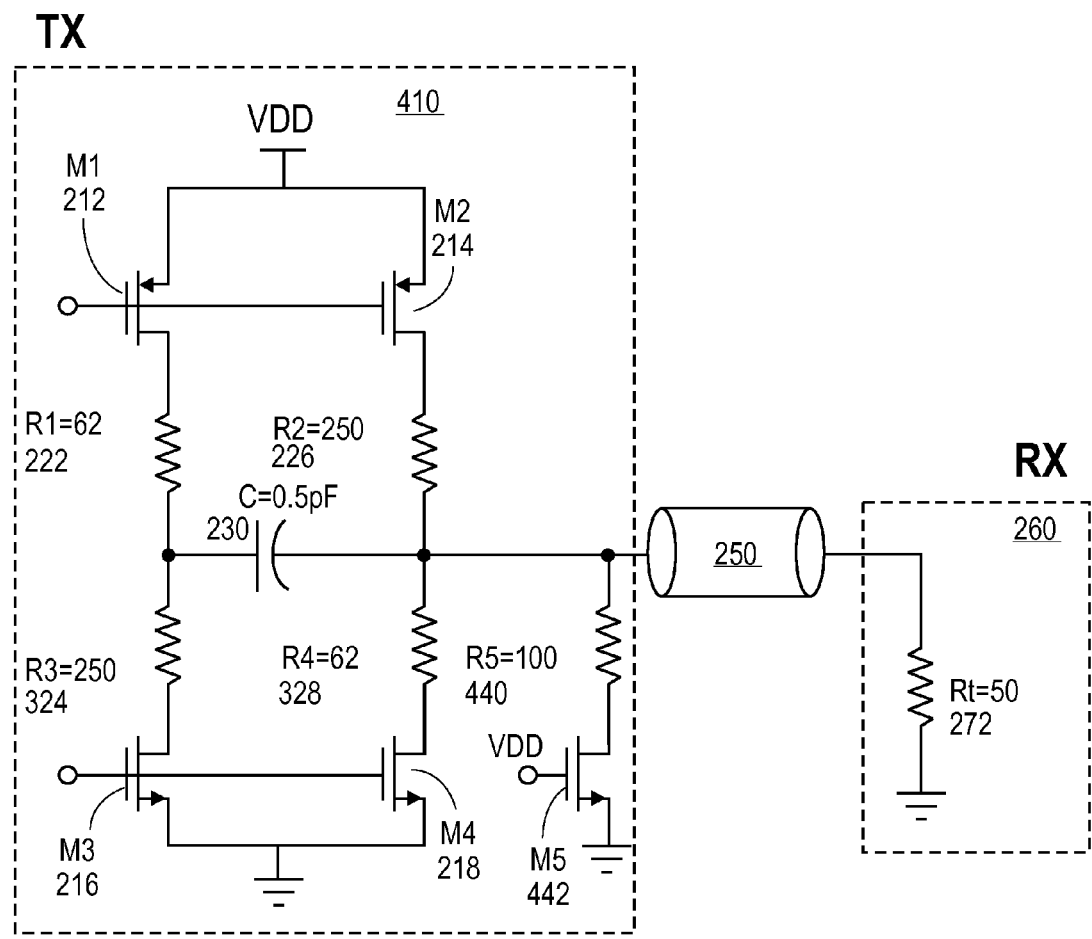
FIG. 4 illustrates an embodiment of a configurable single-ended driver circuit including MOS switches.

FIG. 4 illustrates an embodiment of a configurable single-ended driver circuit including MOS switches. As illustrated in FIG. 4, a single-ended driver 410 is coupled with the receiver 260 via the channel 250. In the illustrated embodiment, in comparison with FIG. 3, driver 410 further includes a fifth branch, the fifth branch including resistor R5 (100 ohms in this illustration) 440 and transistor M5 442, which in this illustration is a third NMOS transistor. In some embodiments, the fifth branch includes n sub-branches, where any number of the sub-branches may be independently enabled or disabled to establish the equivalent value of the circuit components, such as illustrated in the form of FIG. 2A.

In some embodiments, a first terminal of resistor R5 440 is coupled with the output node and a second terminal of R5 is coupled with a first (drain) terminal of transistor M5 442, with a second (source) terminal of M5 being coupled with ground, and a third (gate) terminal of M5 being coupled with source voltage VDD as illustrated, or another voltage level or source that keeps transistor M5 ON. In this illustration, the electrical path through R5 440 and M5 442 provides better impedance matching of the driver during either bit '1' or '0' states, thus providing improved S11 performance, at the cost of increased power dissipation during bit '1' state. As used herein, a '1' state equates to a HIGH signal state (or value) and a '0' state equates to a LOW signal state (or value).

As compared to the embodiments in FIGS. 2 and 3, the embodiment illustrated in FIG. 4 provides an additional degree of freedom for configuring the termination, voltage swing, and signal performance of the driver. This enables improved matching performance in bit '1' state (more significantly at low frequencies) by minimizing the power dissipation in HIGH state. For example, to achieve a termination impedance of 71 ohms at DC for bit '1' state (or logic HIGH) R2 226 and R5 440 can be 250 ohms and 100 ohms, respectively. Without the presence of R5 440, R2 226 would be required to be 71 ohms, leading to significant increase in power consumption.

Figure 5A:
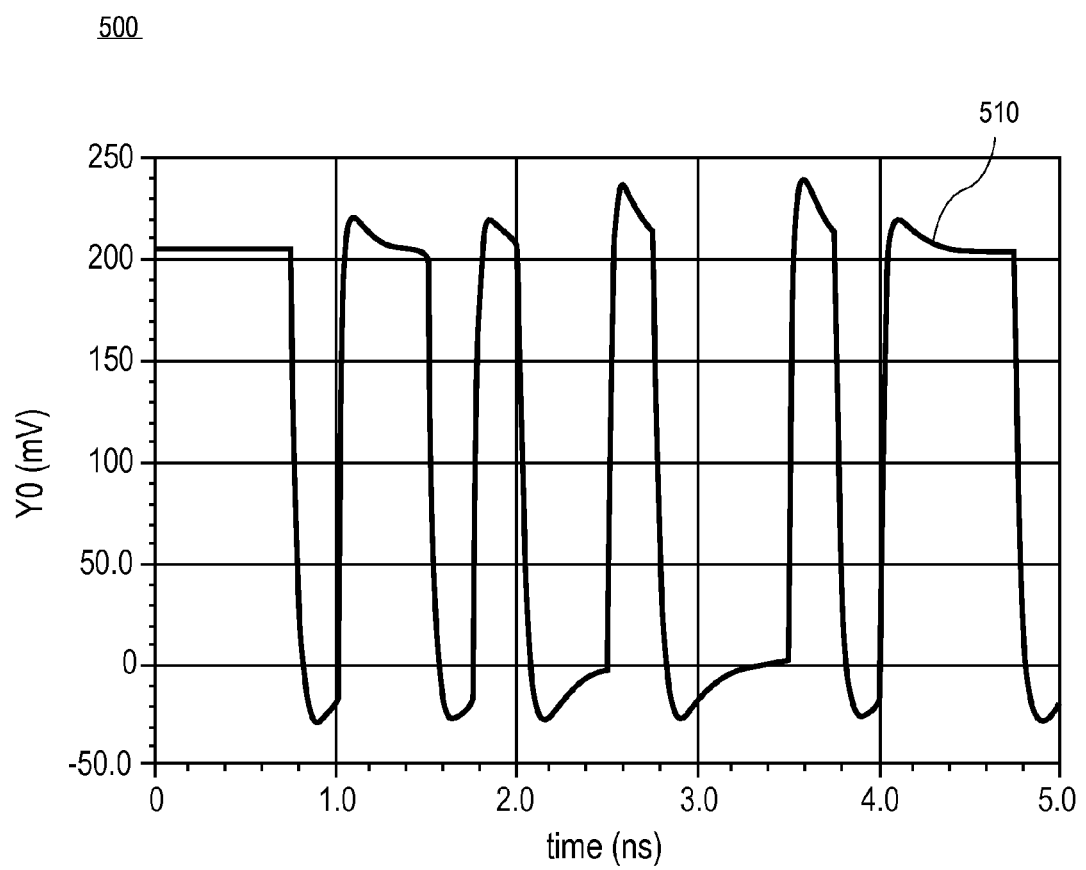
FIG. 5A illustrates time domain performance of an embodiment of a configurable single-ended driver.

FIG. 5A illustrates time domain performance of an embodiment of a configurable single-ended driver. FIG. 5A specifically illustrates a curve 210 of voltage Y0 in mV (millivolts) versus time (in nanoseconds) that represents the performance of a driver such as illustrated in FIGS. 2 and 3.

Figure 5B:
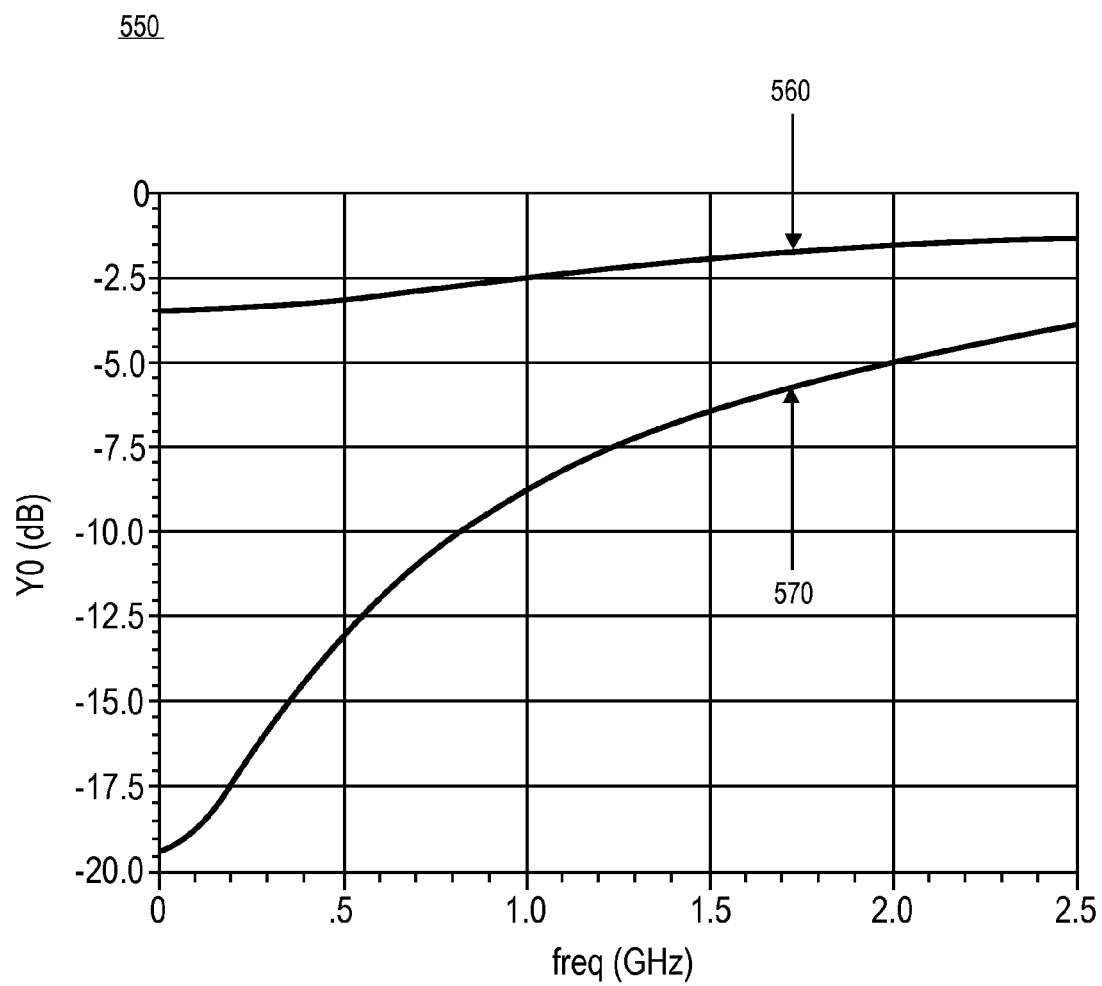
FIG. 5B illustrates S11 performance of a configurable single-ended driver with parasitic capacitance.

FIG. 5B illustrates S11 performance of a configurable single-ended driver with parasitic capacitance. FIG. 5B specifically illustrates performance 550 of the driver illustrated in FIG. 3. In this illustration, S11 is measured assuming a current of I=4 mA (milliamps), with a 2 pF parasitic capacitance to ground at the output node of the driver, wherein the parasitic capacitance may represent package and chip parasitics. In this illustration, the upper curve 560 illustrates bit '1' and the lower curve 570 illustrates bit '0'.

Figure 6A:
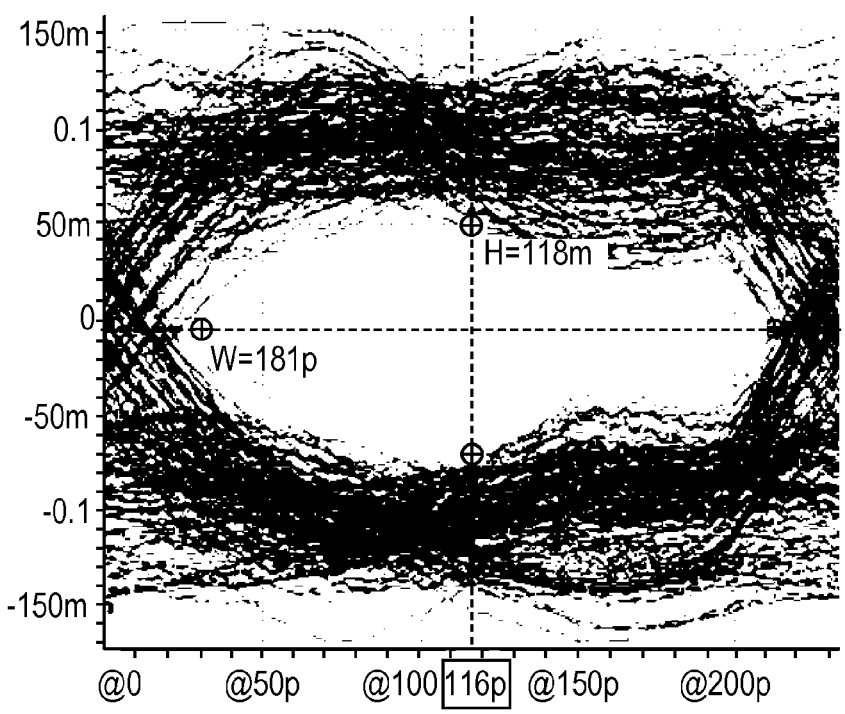
FIGS. 6A and 6B illustrate eye diagram performances of embodiments of configurable single-ended drivers.
Figure 6B:
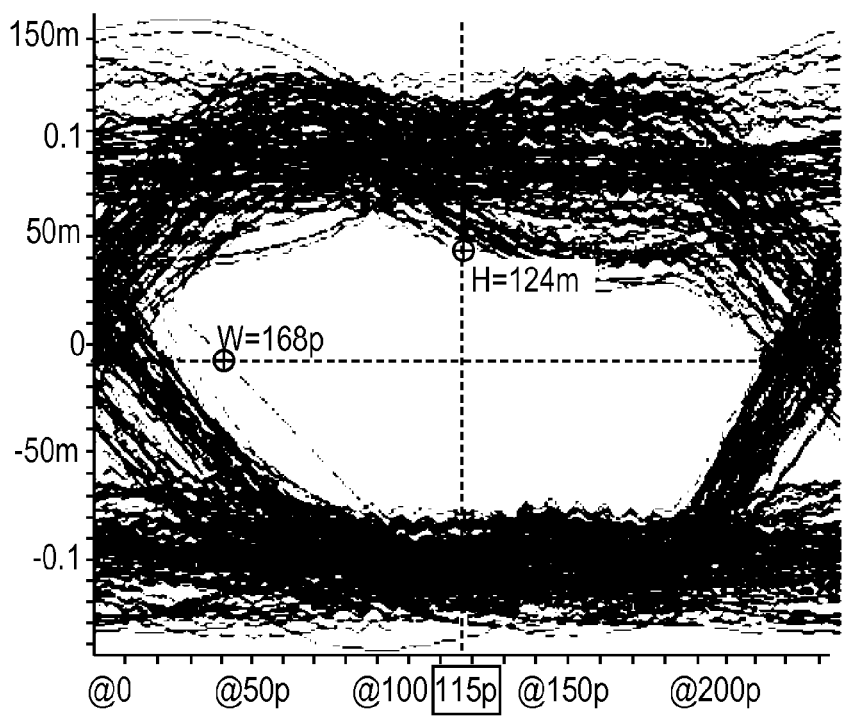

FIG. 6A and FIG. 6B illustrate eye diagram performances of embodiments of configurable single-ended drivers. FIG. 6A illustrates the eye diagram performance of the driver 210 of FIG. 2, and FIG. 6B illustrates the eye diagram performance of the driver 310 of FIG. 3.

Comparing FIGS. 6A and 6B it can be inferred that low frequency matching is critical to having better eye opening. Since FIG. 3 has a lower leg resistance of 62 ohms, it is better matched to the channel than the lower leg resistance of 250 ohms for the driver circuit 210 in FIG. 2, and hence the bit '0' portion of the eye in FIG. 6B has more margin than the eye illustrated in FIG. 6A. Similar results can be obtained for bit '1' if the resistance R2 226 of driver 310 is reduced to 62 ohms with corresponding increase in power dissipation for bit '1'.

Figure 7:
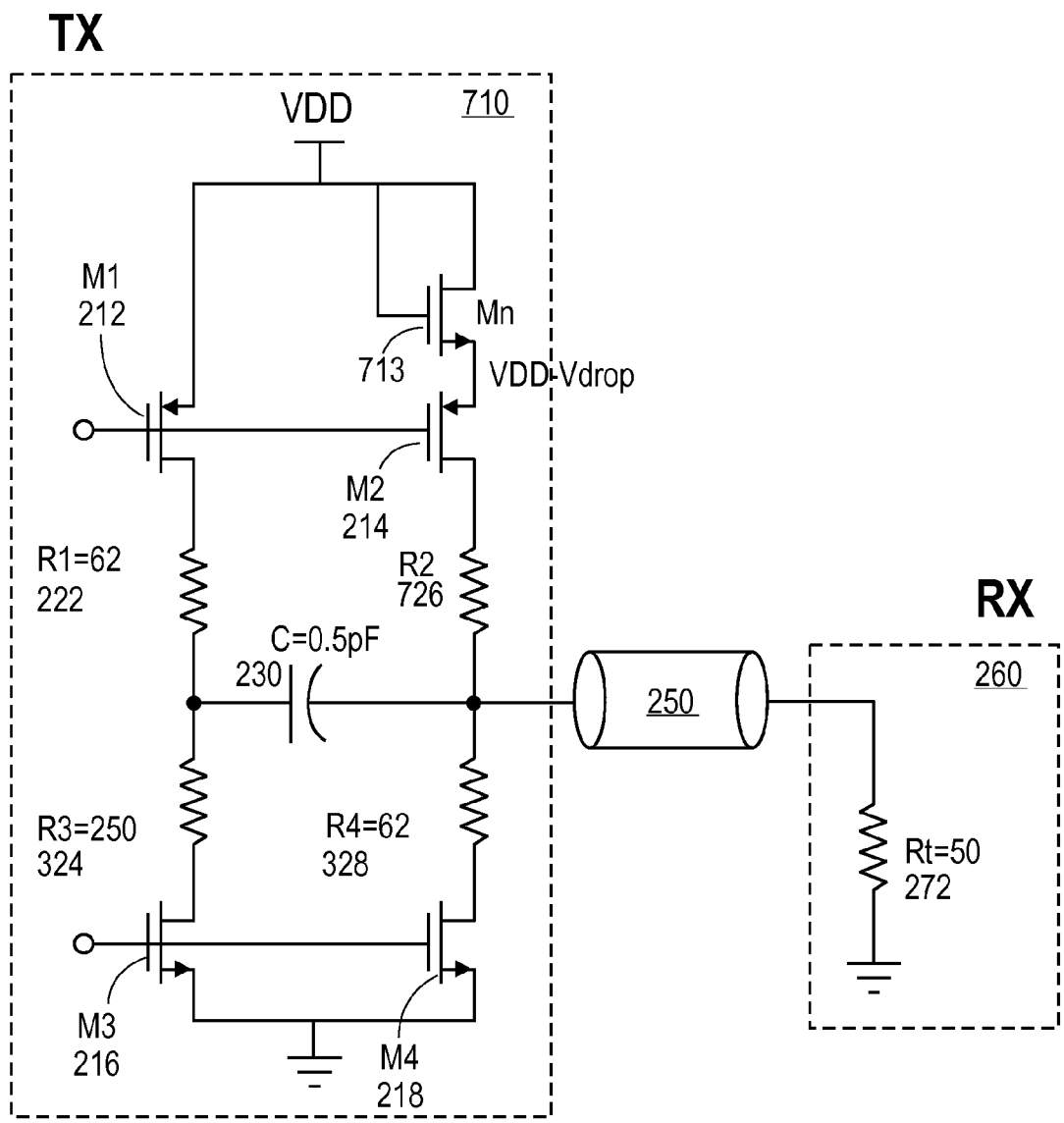
FIG. 7 illustrates an embodiment of a configurable single-ended driver circuit including MOS switches and a diode-connected transistor.

FIG. 7 illustrates an embodiment of a configurable single-ended driver circuit including MOS switches and a diode-connected transistor. In some embodiments, a low power driver circuit includes top PMOS transistors and bottom NMOS transistors as switches, and further includes a diode-connected NMOS added to the current path to create a voltage drop on current path as well as provide a low impedance path to VDD.

As illustrated in FIG. 7, a single-ended driver 710 is coupled with the receiver 260 via the channel 250. In the illustrated embodiment, in comparison with FIG. 3, rather than a first (source) terminal of the second PMOS transistor 214 being connected to the voltage source VDD, a first (drain) terminal and gate of a diode-connected NMOS transistor 713 (designated as Mn) are coupled with VDD, with a second (source) terminal of the diode-connected transistor are connected to the first terminal of the second PMOS transistor 214.

In this illustration, the voltage drop (Vdrop) across the NMOS 713 gate-source diode introduces a degree of freedom in driver design and allows maintenance of driver termination of (R2+1/$g_m$) close to 50 ohms during steady state, where $g_m$ is the transconductance of Mn 713. In this specific example, VDD−Vdrop=0.3 V, where R2 726 is chosen to be 25 ohms and 1/$g_m$ provides another 25Ω. In the illustrated embodiment in FIG. 7, similar to the embodiments in FIGS. 2 and 3, R1/R2 and R3/R4 are initially in parallel at the beginning of the bit period during rise/fall time and then R1/R3 becomes DC-decoupled via capacitor C.

Figure 8:
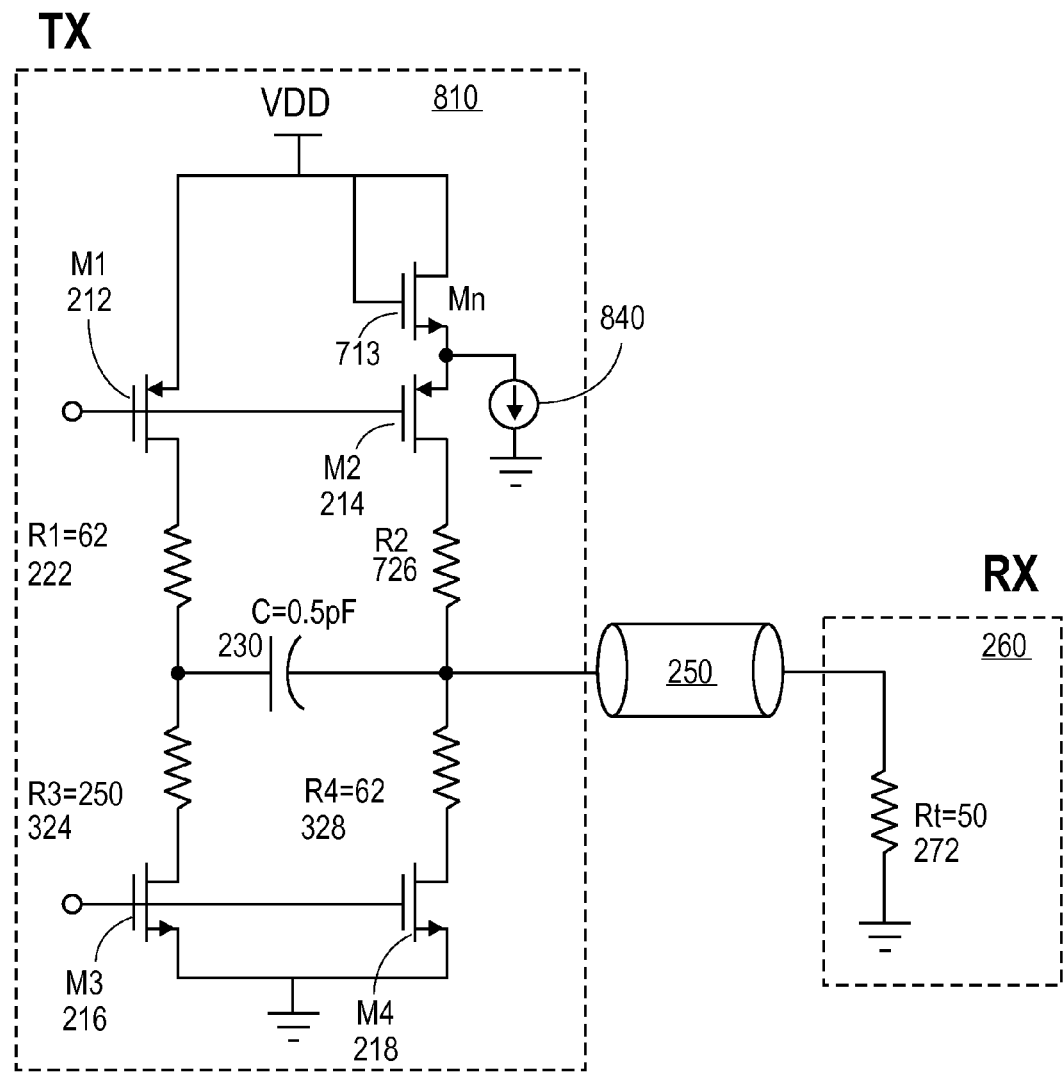
FIG. 8 illustrates an embodiment of a configurable single-ended driver circuit including MOS switches and a diode-connected transistor with a current source.

FIG. 8 illustrates an embodiment of a configurable single-ended driver circuit including MOS switches and a diode-connected transistor with a current source. In some embodiments, a low power driver circuit includes top PMOS transistors and bottom NMOS transistors as switches, and includes a diode-connected NMOS 713 added to the current path to create a voltage drop on the current path. In the illustrated embodiment in FIG. 8, a single-ended driver 810 is coupled with the receiver 260 via a channel 250. As illustrated in FIG. 7, the diode-connected NMOS transistor 713 (designated as Mn) is coupled with VDD, with the second (source) terminal of the diode-connected transistor being connected to the first terminal of the second PMOS transistor 214. In some embodiments, in order to maintain the diode-connected transistor 713 on the edge of the saturation region for fast switching operation, a DC current source 840, such as in the range of 50-100 uA source, is provided into the node between Mn 713 and the second PMOS transistor 214.

Figure 9A:
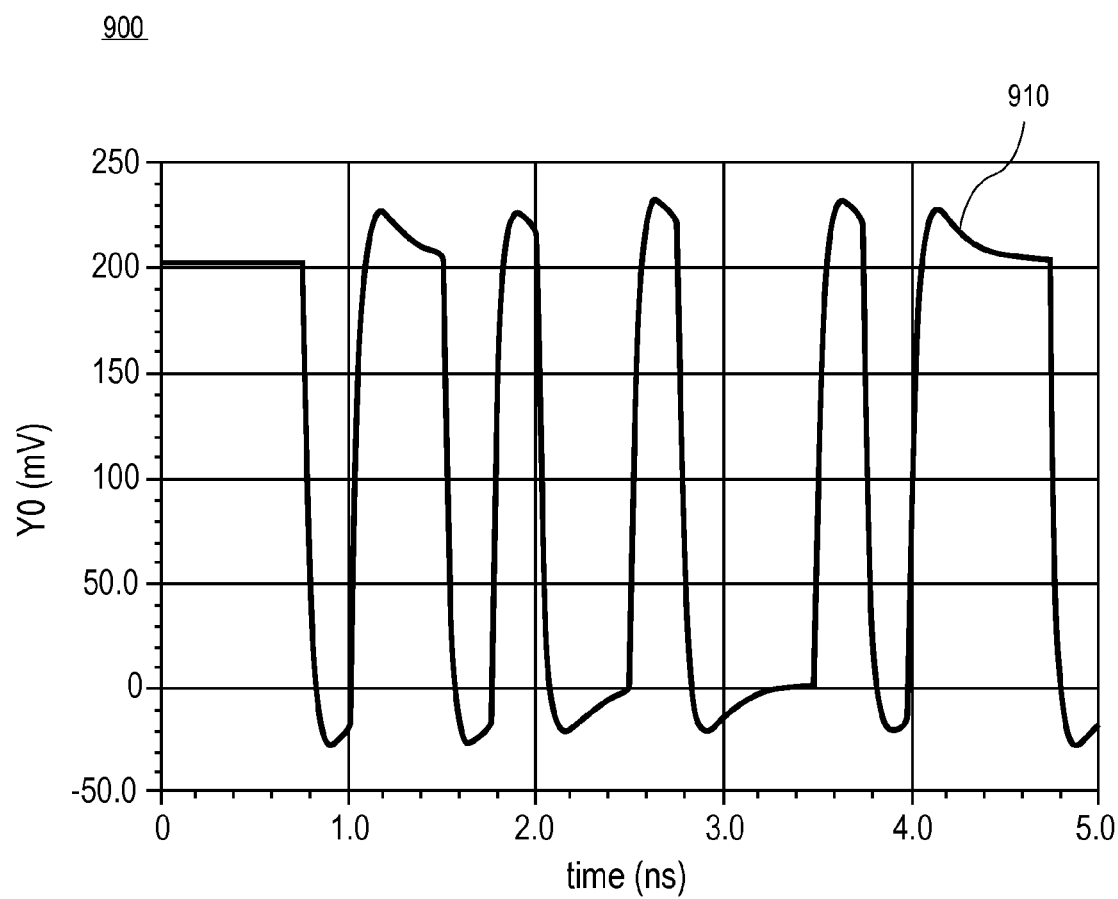
FIG. 9A illustrates time domain performance of an embodiment of a configurable single-ended driver.

FIG. 9A illustrates time domain performance of an embodiment of a configurable single-ended driver. FIG. 9 specifically illustrates a curve 910 of voltage Y0 in mV (millivolts) versus time (in nanoseconds) that represents the performance of a driver such as illustrated in FIGS. 7 and 8.

Figure 9B:
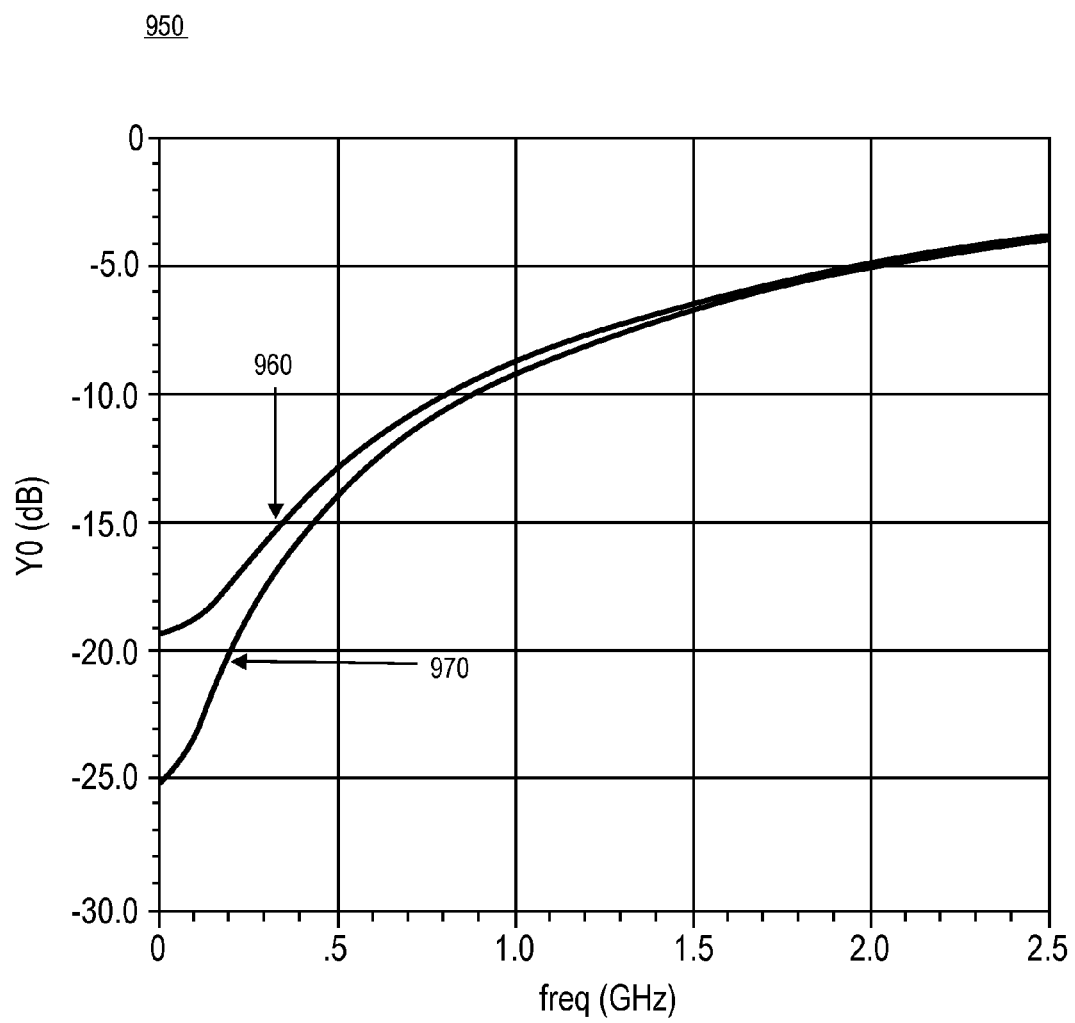
FIG. 9B illustrates the S11 performance of a configurable single-ended driver with parasitic capacitance.

FIG. 9B illustrates the S11 performance of a configurable single-ended driver with parasitic capacitance. FIG. 9B specifically illustrates performance 950 of the drivers illustrated in, for example, FIGS. 7 and 8 including addition of a diode connected transistor such as Mn 713. In this illustration, S11 is measured assuming a current of I=4 mA (milliamps), with a 2 pF parasitic capacitance to ground at the output node of the driver, wherein the parasitic capacitance may represent package and chip parasitics. In this illustration, the upper curve 960 illustrates bit '1' and the lower curve 970 illustrates bit '0'.

Figure 10:
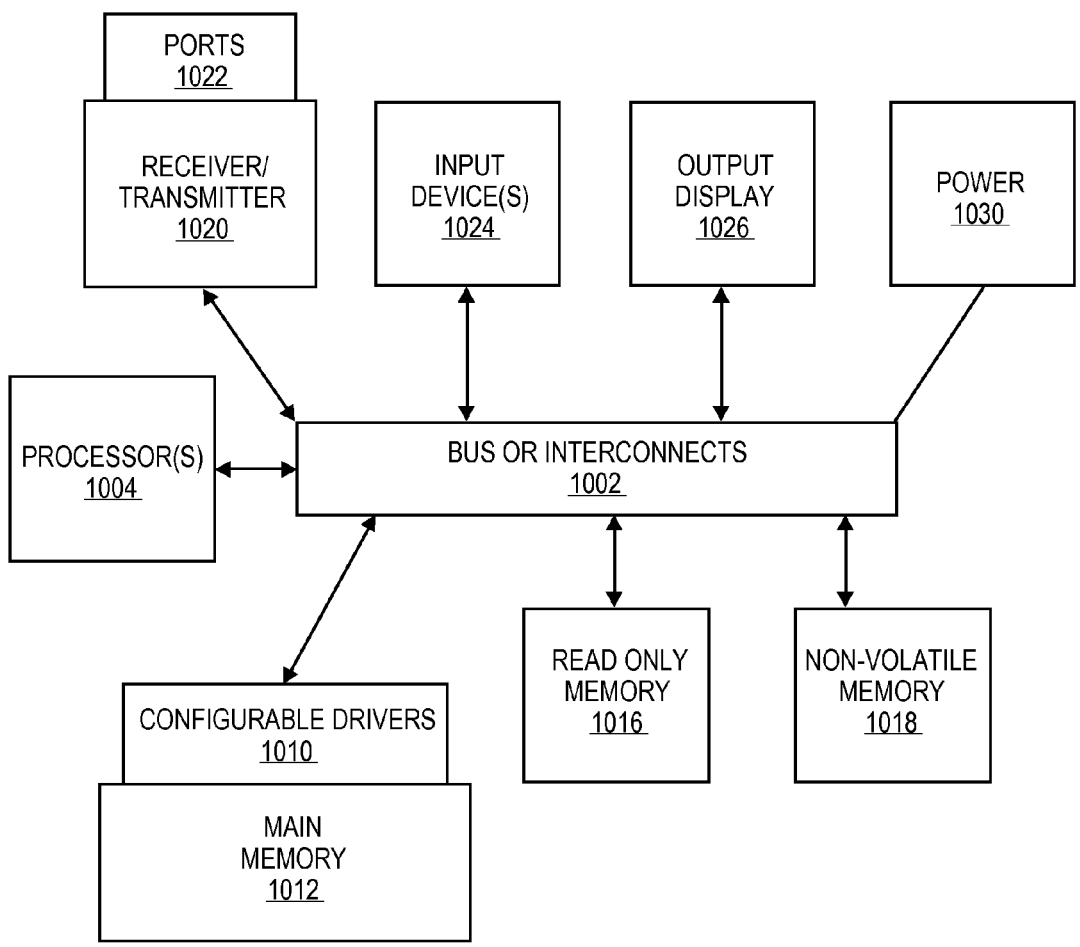
FIG. 10 is an illustration of an apparatus or system including one or more interfaces utilizing a configurable single-ended driver according to an embodiment.

FIG. 10 is an illustration of an apparatus or system including one or more interfaces utilizing a configurable single ended driver according to an embodiment. In this illustration, certain standard and well-known components that are not germane to the present description are not shown. In some embodiments, the apparatus or system 1000 (referred to here generally as an apparatus) comprises a bus or interconnect or other communication means for transmission of data, referred to generally here as interconnect 1002. The interconnect 1002 is illustrated as a single interconnect for simplicity, but may represent multiple different interconnects or buses and the component connections to such interconnects may vary. The interconnect 1002 shown in FIG. 10 is an abstraction that represents any one or more separate physical buses, point-to-point connections, or both connected by appropriate bridges, adapters, or controllers In some embodiments, the apparatus includes one or more configurable single-sided drivers 1010, such as illustrated in FIGS. 2, 3, 4, 7, and 8. For example, the apparatus may include memory utilizing the configurable drivers. In some embodiments, the apparatus 1000 comprises a random access memory (RAM) or other dynamic storage device or element as a main memory 1012 coupled with the interconnect 1002 for storing information and instructions to be executed by one or more processors, where the memory 1012 includes the one or more configurable drivers 1010. RAM memory may include dynamic random access memory (DRAM). In some embodiments, memory of the apparatus may further include certain registers or other special purpose memory.

The apparatus may further include the following:

In some embodiments, the apparatus 1000 may include a processing means, such as one or more processors 1004 coupled with the interconnect 1002 for processing information. The processors 1004 may comprise one or more physical processors and one or more logical processors.

The apparatus 1000 may include a read only memory (ROM) 1016 or other static storage device for storing static information and instructions for the processors 1004. The apparatus 1000 may include one or more non-volatile memory elements 1018 for the storage of certain elements, including, for example, flash memory, hard disk drive, or solid-state drive.

One or more transmitters or receivers 1020 may also be coupled with the interconnect 1002. In some embodiments, the receivers or transmitters 1020 may be coupled with one or more ports 1022, where the ports may include, for example, one or more HDMI™ (High-Definition Multimedia Interface) ports, and one or more MHL™ (Mobile High-Definition Link) ports.

In some embodiments, the apparatus 1000 includes one or more input devices 1024, where the input devices include one or more of a keyboard, mouse, touch pad, voice command recognition, gesture recognition, or other device for providing an input to a computing system.

The apparatus 1000 may also be coupled via the interconnect 1002 to an output device 1026. In some embodiments, the display 1026 may include a liquid crystal display (LCD) or any other display technology, for displaying information or content to a user. In some environments, the display 1026 may include a touch-screen that is also utilized as at least a part of an input device. In some environments, the display 1026 may be or may include an audio device, such as a speaker for providing audio information.

The apparatus 1000 may also comprise a power component 1030, which may comprise a power supply, a battery, a solar cell, a fuel cell, or other system or device for providing or generating power. The power provided by the power component 1030 may be distributed as required to elements of the apparatus 1000.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to, with, or together with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

In some embodiments, an apparatus includes an interface with a channel; and a single-ended driver to drive a signal on the channel, wherein the driver includes a mechanism to configure characteristics of the driver including the mechanism to: configure a termination resistance of the driver, configure a voltage swing of the driver, and configure a signal response of the driver.

In some embodiments, the driver does not receive a bias voltage.

In some embodiments, the driver operates with a single source voltage for the circuit.

In some embodiments, the configuration of the signal response predominantly affects the signal response during the signal rise times and fall times for the driver.

In some embodiments, the mechanism includes a network including transistors and resistors for modifying the characteristics of the driver. In some embodiments, the mechanism further includes a capacitance to modify a signal response of the driver.

In some embodiments, the network includes a plurality of branches, and wherein one or more branches of the plurality of branches includes a plurality of sub-branches in parallel, wherein each sub-branch of the plurality of sub-branches includes a switching component to enable or disable the sub-branch. In some embodiments, the switching component is a transistor. In some embodiments, each sub-branch of the plurality of sub-branches of a branch includes a resistor, a resistance of the branch including a resistance of each enabled sub-branch in parallel. In some embodiments, each sub-branch of the plurality of sub-branches of a branch includes a capacitor, a capacitance of the branch including a capacitance of each enabled sub-branch in parallel.

In some embodiments, enabling or disabling the sub-branches of one or more branches operates to configure one or more of the termination resistance of the driver, the voltage swing of the driven signal, or the signal response of the driver.

In some embodiments, the mechanism is to allow configuring one or more of the termination resistance of the driver, the voltage swing of the driver, or the signal response of the driver independently of one or more of the other characteristics of the driver.

In some embodiments, the transistors of the mechanism are MOS transistors.

In some embodiments, a single-ended driver to drive a signal on a channel includes a means for configuring characteristics of the driver, the means for configuring the characteristics of the driver including: a means for configuring a termination resistance of the driver; a means for configuring a voltage swing of the driven signal; and a means for configuring a signal response of the driver.

In some embodiments, the means for configuring the characteristics of driver includes a plurality of branches, wherein at least a first branch of the plurality of branches includes a plurality of sub-branches, wherein each of the sub-branches may be enabled or disabled.

In some embodiments, enabling or disabling the sub-branches operates to configure one or more of the termination resistance of the driver, the voltage swing of the driven signal, or the signal response of the driver.

In some embodiments, the means for configuring the characteristics of the driver includes a means for configuring one or more of the characteristics of the driver independently of one or more of the other characteristics of the driver.

In some embodiments, an apparatus includes an interface with a channel; and a single-ended driver to drive a signal on the channel, wherein the driver includes: a first portion to switch on when the driver drives a first signal value on the channel, the first portion including a first branch and a second branch, a second portion to switch on when the driver drives a second signal value on the channel, the second portion including a third branch and a fourth branch, the first branch and the third branch being coupled together at a first node and the second branch and the fourth branch being coupled together at a second node, the second node being an output node, and a third portion including a capacitance branch, a first end of the third portion being coupled with the first node and a second end of the third portion being coupled with the second node.

In some embodiments, one or more of the branches of the driver includes a plurality of sub-branches in parallel. In some embodiments, each sub-branch of a branch includes a switching component, wherein the switching component of each sub-branch is operable to enable or disable the sub-branch. In some embodiments, enabling or disabling the sub-branches of the one or more branches operates to configure one or more of a plurality of characteristics of the driver, the plurality of characteristics of the driver including a termination resistance of the driver, a voltage swing of a driven signal, or a signal response of the driver.

In some embodiments, the first branch of the first portion includes: a first transistor including first, second, and third terminals, the first terminal of the first transistor being coupled with a source voltage; and a first resistance, a first terminal of the first resistance being coupled with the second terminal of the first transistor and a second terminal of the first resistance being coupled with the first node.

In some embodiments, the second branch of the first portion includes: a second transistor including first, second, and third terminals; and a second resistance, a first terminal of the second resistance being coupled with the second terminal of the first transistor and a second terminal of the second resistance being coupled with the second node.

In some embodiments, the first and second transistors are PMOS transistors, the first and second transistors operating as switches to switch on for the first signal value. In some embodiments, the first signal value is a HIGH signal value.

In some embodiments, the first terminal of the second transistor is coupled with the source voltage.

In some embodiments, the apparatus further includes a fifth branch coupled with the output node, the fifth branch including: a resistance, a first terminal of the resistance being coupled with the output node; and a transistor including first, second, and third terminals, the first terminal of the transistor being coupled with a second terminal of the resistance of the fifth branch, the second terminal of the transistor being coupled with ground, and a third terminal of the transistor being coupled with the source voltage.

In some embodiments, the apparatus further includes a diode-connected transistor including first, second, and third terminals, wherein the first terminal and the third terminal of the diode-connected transistor are coupled with the source voltage, and the second terminal of the diode-connected transistor is coupled with the first terminal of the second transistor. In some embodiments, the apparatus further includes a current source, a terminal of the current source being coupled with the second terminal of the diode-connected transistor and the first terminal of the second transistor.

In some embodiments, the third branch of the second portion of the apparatus includes: a third resistance, a first terminal of the third resistance being coupled with the first node; and a third transistor including first, second, and third terminals, the first terminal of the third transistor being coupled with a second terminal of the second resistance and the second terminal of the third transistor being coupled with ground. In some embodiments, the fourth branch of the second portion of the apparatus includes: a fourth resistance, a first terminal of the fourth resistance being coupled with the second node; and a fourth transistor including first, second, and third terminals, the first terminal of the fourth transistor being coupled with a second terminal of the fourth resistance and the second terminal of the fourth transistor being coupled with ground. In some embodiments, the third and fourth transistors are NMOS transistors, the third and fourth transistors operating as switches to switch on for the second signal value. In some embodiments, the second signal value is a LOW signal value.

In some embodiments, the third portion includes a capacitor.

What is claimed is:

1. An apparatus comprising:
an interface to a channel; and
a single-ended driver to drive a signal on the channel, the driver comprising:
one or more branches, each of the one or more branches between a source voltage or a ground voltage and an output node, the one or more branches each comprising a transistor controllable by an input signal, a diode-connected transistor that maintains a termination resistance of the driver in a steady state operation and two or more sub-branches coupled in parallel with each other, each sub-branch including an impedance element controlling an impedance of the sub-branch and a switching component configurable to enable or disable the sub-branch and
a driver control circuit to control switching of each of the switching components in each of the sub-branches to configure characteristics of the driver, the characteristics comprising:
a termination resistance of the driver,
a voltage swing of the driven signal, and
a signal response of the driver.

2. The apparatus of claim 1, wherein the driver does not receive a bias voltage.

3. The apparatus of claim 1, wherein the driver operates with a single source voltage for the circuit.

4. The apparatus of claim 1, wherein the configuration of the signal response predominantly affects the signal response during the signal rise times and fall times for the driver.

5. The apparatus of claim 1, wherein the switching component includes a network including transistors and resistors for modifying the characteristics of the driver.

6. The apparatus of claim 5, wherein the switching component further includes a capacitor to modify a signal response of the driver.

7. The apparatus of claim 5, wherein the switching component configures one or more of the termination resistance of the driver, the voltage swing of the driven signal, or the signal response of the driver independently of one or more of the other characteristics of the driver.

8. The apparatus of claim 5, wherein the transistors are MOS (Metal Oxide Semiconductor) transistors.

9. The apparatus of claim 1, wherein the switching component is a transistor.

10. The apparatus of claim 1, wherein each sub-branch of a branch includes a resistor and resistance of the branch is based on resistance of each enabled sub-branch in parallel.

11. The apparatus of claim 1, wherein each sub-branch of a branch includes a capacitor and capacitance of the branch is based on capacitance of each enabled sub-branch in parallel.

12. A single-ended driver to drive a signal on a channel, the single-ended driver comprising:
one or more branches, each of the one or more branches comprising a transistor coupled between a source voltage or a ground voltage, a diode-connected transistor that maintains a termination resistance of the driver in a steady state operation and two or more sub-branches coupled in parallel with each other, each sub-branch including an impedance element controlling an impedance of the sub-branch and a switching component configurable to enable or disable the sub-branch; and
a driver control circuit to control switching of each of the switching components in each of the sub-branches configure characteristics of the single-ended driver, the characteristics comprising:
a termination resistance of the single-ended driver,
a voltage swing of the driven signal, and
a signal response of the single-ended driver.

13. The driver of claim 12, wherein the switching component configures one or more of the characteristics of the driver independently of one or more of the other characteristics of the driver.

14. An apparatus comprising:
an interface with a channel; and
a single-ended driver to drive a signal on the channel, wherein the driver includes:
a first portion to switch on when the driver drives a first signal value on the channel, the first portion including a first branch and a second branch;
a second portion to switch on when the driver drives a second signal value on the channel, the second portion including a third branch and a fourth branch, the first branch and the third branch being coupled together at a first node and the second branch and the fourth branch being coupled together at a second node, the second node being an output node,
a third portion including a capacitance branch, a first end of the third portion being coupled with the first node and a second end of the third portion being coupled with the second node; and
wherein the first branch comprises a first transistor coupled between a voltage source, a diode-connected transistor that maintains a termination resistance of the driver in a steady state operation and a first set of two or more sub-branches coupled in parallel with each other, the second branch comprises a second transistor coupled between the voltage source and a second set of two or more sub-branches coupled in parallel with each other, the third branch comprises a third transistor coupled between ground voltage and a third set of two or more sub-branches coupled in parallel with each other, and the fourth branch comprises a fourth transistor coupled between the ground voltage and a fourth set of two or more sub-branches coupled in parallel with each other,
wherein each sub-branch of the first, second, third, and fourth sets of sub-branches includes an impedance element controlling an impedance of the sub-branch, a switching component configurable to enable or disable the sub-branch to configure characteristics of the single-ended driver, the characteristics comprising:
a termination resistance of the single-ended driver,
a voltage swing of a driven signal, and
a signal response of the single-ended driver.

15. The apparatus of claim 14, wherein the switching component of a sub-branch is a transistor.

16. The apparatus of claim 14, wherein the first and second transistors are PMOS (P-type Metal Oxide Semiconductor) transistors, the first and second transistors operating as switches to switch on for the first signal value.

17. The apparatus of claim 16, wherein the first signal value is a HIGH signal value.

18. The apparatus of claim 14, wherein the diode-connected transistor including first, second, and third terminals, wherein the first terminal and the third terminal of the diode-connected transistor are coupled with the source voltage, and the second terminal of the diode-connected transistor is coupled with a first terminal of the second transistor.

19. The apparatus of claim 18, further comprising a current source, a terminal of the current source being coupled with the second terminal of the diode-connected transistor and the first terminal of the second transistor.

20. The apparatus of claim 14, wherein the third and fourth transistors are NMOS (N-type Metal Oxide Semiconductor) transistors, the third and fourth transistors operating as switches to switch on for the second signal value.

21. The apparatus of claim 20, wherein the second signal value is a LOW signal value.

22. The apparatus of claim 14, wherein the third portion includes a capacitor.

* * * * *